(12) United States Patent
Liu et al.

(10) Patent No.: US 11,289,411 B2
(45) Date of Patent: Mar. 29, 2022

(54) SUBSTRATE STRUCTURE AND METHOD FOR MANUFACTURING THE SAME

(71) Applicant: Advanced Semiconductor Engineering, Inc., Kaohsiung (TW)

(72) Inventors: Syu-Tang Liu, Kaohsiung (TW); Tsung-Tang Tsai, Kaohsiung (TW); Huang-Hsien Chang, Kaohsiung (TW); Ching-Ju Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/942,579

(22) Filed: Jul. 29, 2020

(65) Prior Publication Data
US 2021/0233836 A1 Jul. 29, 2021

Related U.S. Application Data

(63) Continuation of application No. 16/774,161, filed on Jan. 28, 2020, now Pat. No. 10,741,483.

(51) Int. Cl.
| | | |
|---|---|---|
| H05K 1/02 | (2006.01) | |
| H05K 1/11 | (2006.01) | |
| H01L 23/498 | (2006.01) | |
| H01L 21/48 | (2006.01) | |
| H01L 23/00 | (2006.01) | |
| H01L 23/13 | (2006.01) | |

(52) U.S. Cl.
CPC .... *H01L 23/49816* (2013.01); *H01L 21/4853* (2013.01); *H01L 23/13* (2013.01); *H01L 23/49822* (2013.01); *H01L 23/49838* (2013.01); *H01L 24/16* (2013.01); *H01L 2224/16227* (2013.01); *H01L 2224/16238* (2013.01)

(58) Field of Classification Search
CPC . H05K 1/0228; H01L 23/49838; H01L 24/11; H01L 2224/16227
See application file for complete search history.

(56) References Cited

U.S. PATENT DOCUMENTS

| | | |
|---|---|---|
| 6,153,938 A | 11/2000 | Kanda et al. |
| 2004/0176938 A1 | 9/2004 | Gisin et al. |
| 2004/0212087 A1* | 10/2004 | Murayama ............ H01L 23/562 257/738 |
| 2006/0166402 A1 | 7/2006 | Lim et al. |

(Continued)

FOREIGN PATENT DOCUMENTS

CN 110071089 A 7/2019

OTHER PUBLICATIONS

Notice of Allowance for U.S. Appl. No. 16/774,161, dated Apr. 4, 2020, 9 pages.

*Primary Examiner* — Hoa C Nguyen
(74) *Attorney, Agent, or Firm* — Foley & Lardner LLP

(57) ABSTRACT

A substrate structure includes a wiring structure, a first bump pad, a second bump pad and a compensation structure. The wiring structure includes a plurality of redistribution layers. The first bump pad and the second bump pad are bonded to and electrically connected to the wiring structure. An amount of redistribution layers disposed under the first bump pad is greater than an amount of redistribution layers disposed under the second bump pad. The compensation structure is disposed under the second bump pad.

19 Claims, 19 Drawing Sheets

(56) References Cited

U.S. PATENT DOCUMENTS

| | | |
|---|---|---|
| 2013/0069229 A1 | 3/2013 | Kang et al. |
| 2017/0373044 A1 | 12/2017 | Das et al. |
| 2018/0061765 A1* | 3/2018 | Gozu ................. H01L 23/5383 |
| 2018/0174990 A1* | 6/2018 | Park ........................ H01L 24/06 |
| 2019/0198486 A1 | 6/2019 | Kim et al. |
| 2020/0043841 A1* | 2/2020 | Arai ...................... H01L 21/481 |
| 2021/0022250 A1* | 1/2021 | Jung ..................... H05K 1/115 |

* cited by examiner

SUBSTRATE STRUCTURE AND METHOD FOR MANUFACTURING THE SAME

CROSS-REFERENCE TO RELATED APPLICATION

This application is a continuation of U.S. patent application Ser. No. 16/774,161 filed Jan. 28, 2020, the contents of which is incorporated herein by reference in its entirety.

BACKGROUND

1. Field of the Disclosure

The present disclosure relates to a substrate structure and a method, and to a substrate structure including a compensation structure, and a method for manufacturing the substrate structure.

2. Description of the Related Art

A substrate structure may include a dielectric structure, a plurality of redistribution layer embedded in the dielectric structure, and a plurality of bump pads disposed on the dielectric structure and electrically connected to the redistribution layers. The dielectric structure includes a plurality of dielectric layers. However, due to the layout of the redistribution layers, a top surface of each of the dielectric layers that covers the redistribution layer may not be flat or planar. Thus, a top surface of the dielectric structure may not be flat or planar. Accordingly, the bump pads disposed thereon may not be at a same level. Due to the level differences between these bump pads, a semiconductor die may not be properly connected to each of the bump pads of the substrate structure.

SUMMARY

In some embodiments, a substrate structure includes a wiring structure, a first bump pad, a second bump pad and a compensation structure. The wiring structure includes a plurality of redistribution layers. The first bump pad and the second bump pad are bonded to and electrically connected to the wiring structure. An amount of redistribution layers disposed under the first bump pad is greater than an amount of redistribution layers disposed under the second bump pad. The compensation structure is disposed under the second bump pad.

In some embodiments, a substrate structure includes a wiring structure, a bump pad and a dummy metal layer. The wiring structure includes a dielectric layer and a redistribution layer disposed on the dielectric layer. The bump pad is bonded to and electrically connected to the wiring structure. The bump pad has a projection region on the dielectric layer. The projection region of the bump pad has a first area. A portion of the redistribution layer is disposed within the projection region of the bump pad. The portion of the redistribution layer in the projection region has a second area. The second area is less than 40% of the first area. The dummy metal layer is disposed on the dielectric layer. At least a portion of the dummy metal layer is disposed within the projection region of the bump pad on the dielectric layer.

In some embodiments, a method for manufacturing a substrate structure includes: (a) providing a wiring structure and a compensation structure, wherein the wiring structure includes a plurality of redistribution layers, an amount of redistribution layers at a position corresponding to a first position is greater than an amount of redistribution layers at a position corresponding to a second position, and the compensation structure is located at the position corresponding to the second position; and (b) forming a first bump pad and a second bump pad on and electrically connected to the wiring structure, wherein the first bump pad and the second bump pad are respectively located at the position corresponding to the first position and the position corresponding to the second position, and the first bump pad and the second bump pad are substantially at a same level.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
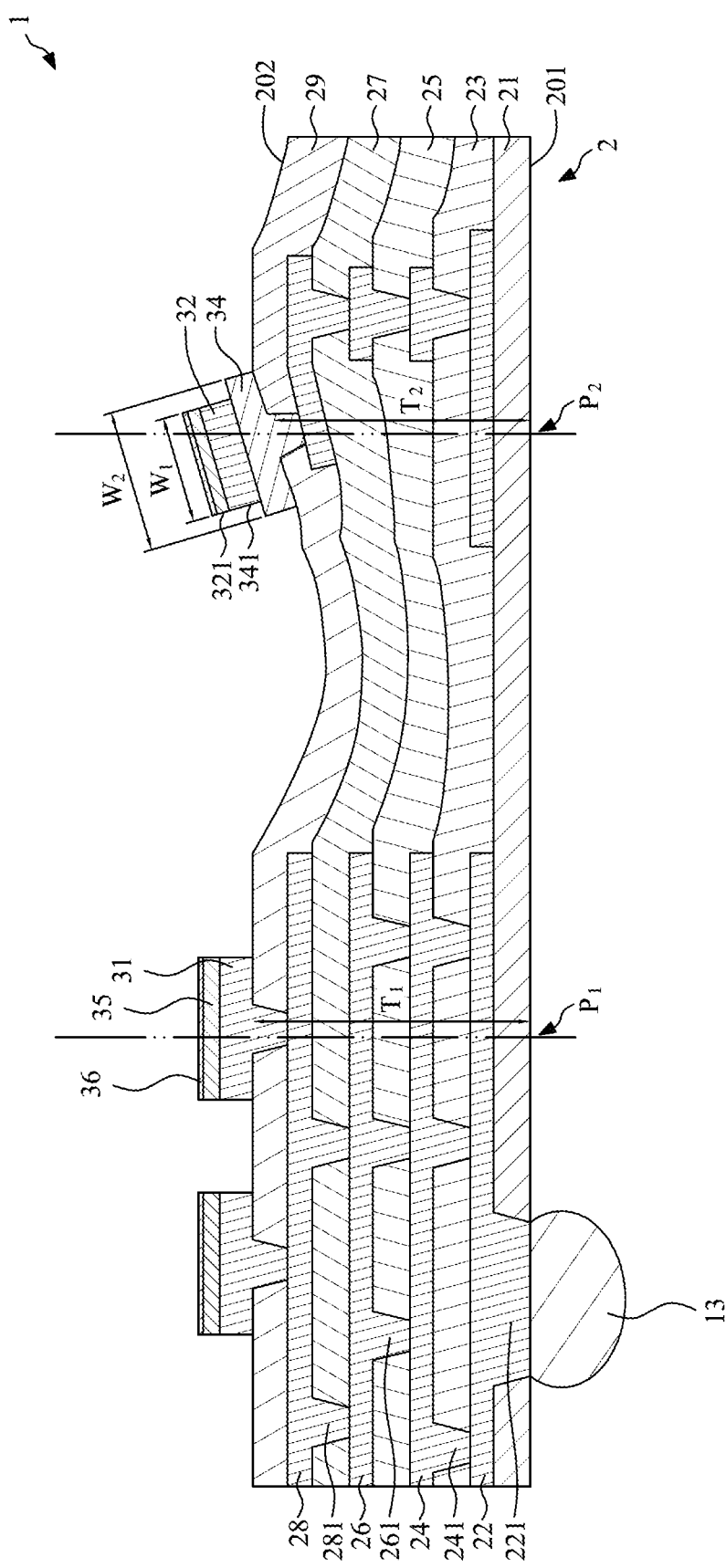
FIG. 1 illustrates a cross-sectional view of an example of a substrate structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A comparative substrate structure may include a first dielectric layer, a first redistribution layer disposed on the first dielectric layer, a second dielectric layer covering the first redistribution layer, and a second redistribution layer disposed on the second dielectric layer, etc. The substrate structure may further include a plurality of bump pads disposed on a topmost dielectric layer.

In the comparative substrate structure, since the second dielectric layer covers the first redistribution layer, a shape of a top surface of the second dielectric layer may be affected by the first redistribution layer which is a patterned layer. That is, the top surface of the second dielectric layer may not be flat or planar. For example, the top surface of the second dielectric layer may be relatively high at a positon where the first redistribution layer exists, and may be relatively low at a position where the first redistribution is absent. The level difference may accumulate when the amount of the redistribution layers and the dielectric layers increase. In some embodiments, a level difference between a highest position and a lowest position of a top surface of the topmost dielectric layer may be about 4 µm, or even greater. Accordingly, the bump pads disposed on the topmost dielectric layer may not be at a same level, which may adversely affect the bonding quality between the comparative substrate structure and a semiconductor die. For example, the semiconductor die may not be properly connected to each of the bump pads of the substrate structure.

The present disclosure addresses at least some of the above concerns and provides for a substrate structure including a compensation structure for compensating the level difference of the bump pads. Some embodiments of the present disclosure further provides for a method for manufacturing the substrate structure.

FIG. 1 illustrates a cross-sectional view of a substrate structure 1 according to some embodiments of the present disclosure. The substrate structure 1 may include a wiring structure 2, a first bump pad 31, a second bump pad 32, a compensation structure (e.g., an intermediate bump 34) and an external connector 13.

The wiring structure 2 includes a plurality of redistribution layers, such as four redistribution layers (e.g., a first redistribution layer 22, a second redistribution layer 24, a third redistribution layer 26, a fourth redistribution layer 28) as shown in FIG. 1. In some embodiments, the wiring structure 2 may include a first dielectric layer 21, a first redistribution layer 22, a second dielectric layer 23, a second redistribution layer 24, a third dielectric layer 25, a third redistribution layer 26, a fourth dielectric layer 27, a fourth redistribution layer 28, and a fifth dielectric layer 29. However, in other embodiments, the wiring structure 2 may include more or less redistribution layers and/or dielectric layers.

The first dielectric layer 21 may be a bottommost dielectric layer of the wiring structure 2. As shown in FIG. 1, the first dielectric layer 21 may be substantially planar. That is, a thickness of the first dielectric layer 21 may be substantially consistent.

The first redistribution layer 22 is disposed on the first dielectric layer 21. The first redistribution layer 22 may be a patterned layer that includes at least one conductive trace and at least one conductive pad. As shown in FIG. 1, the first redistribution layer 22 includes at least one first conductive via 221 extending through the first dielectric layer 21 to form an external contact. The external connector 13 is connected to the first conductive via 221 of the first dielectric layer 21 for external connection purpose.

The second dielectric layer 23 is disposed on the first dielectric layer 21 and covers the first redistribution layer 22. The second dielectric layer 23 may be conformal to the first redistribution 22. For example, the second dielectric layer 23 may be applied in a liquid form by coating, or in a dry film form by laminating. The second dielectric layer 23 may be applied in a constant volume over the entire first dielectric layer 21 to cover the first redistribution layer 22. Hence, the "topography" of the second dielectric layer 23 may be affected by the first redistribution layer 22 disposed thereunder. That is, the "topography" of the second dielectric layer 23 may be ascending at a position where the first redistribution layer 22 exists, and may be descending at a position where the first redistribution layer 22 is absent. Accordingly, a top surface of the second dielectric layer 23 may not be flat or planar. In some embodiments, the top surface of the second dielectric layer 23 may be in a wave shape.

The second redistribution layer 24 is disposed on the second dielectric layer 23. The second redistribution layer 24 may be a patterned layer that includes at least one conductive trace and at least one conductive pad. As shown in FIG. 1, the second redistribution layer 24 includes at least one second conductive via 241 extending through the second dielectric layer 23 to contact and electrically connect the first redistribution layer 22. In some embodiments, as shown in FIG. 1, second redistribution layer 24 includes a plurality of second conductive vias 241.

The third dielectric layer 25 is disposed on the second dielectric layer 23 and covers the second redistribution layer 24. The third dielectric layer 25 may be conformal to the second redistribution layer 24 and the second dielectric layer 23. Similar to the second dielectric layer 23 described above, the "topography" of the third dielectric layer 25 may be ascending at a position where the first redistribution layer 22 and second redistribution layer 24 exist, and may be descending at a position where the first redistribution layer 22 and/or the second redistribution layer 24 is omitted. Accordingly, a top surface of the third dielectric layer 25 may not be flat or planar. For example, at a position corresponding to a position $P_1$ shown in FIG. 1, the top surface of the third dielectric layer 25 is at a higher level due to the existence of the second redistribution layer 24. In contrast, at a position corresponding to a position $P_2$ shown in FIG. 1, the top surface of the third dielectric layer 25 is at a lower level due to the absent of the second redistribution 24. In some embodiments, a level difference of the top surface of the third dielectric layer 25 between the position corresponding to the first positon $P_1$ and the position corresponding to the second position $P_2$ may be about 2 µm.

The third redistribution layer 26 is disposed on the third dielectric layer 25. The third redistribution layer 26 may be a patterned layer that includes at least one conductive trace and at least one conductive pad. As shown in FIG. 1, the third redistribution layer 26 includes at least one third conductive via 261 extending through the third dielectric layer 25 to contact and electrically connect the second redistribution layer 24. In some embodiments, as shown I FIG. 1, the third redistribution layer 26 includes a plurality of third conductive vias 261. Some of the third conductive vias 261 are disposed on respective ones of the second conductive vias 241.

The fourth dielectric layer 27 is disposed on the third dielectric layer 25 and covers the third redistribution layer 26. The fourth dielectric layer 27 may be conformal to the third redistribution layer 26 and the third dielectric layer 25. Similar to the second dielectric layer 23 and the third dielectric layer 25 described above, the "topography" of the fourth dielectric layer 27 may be ascending at a position where the first redistribution layer 22, the second redistribution layer 24 and the third redistribution layer 26 exist, and may be descending at a position where the first redistribution layer 22, the second redistribution layer 24 and/or the third redistribution layer 26 is omitted. Accordingly, a top surface of the fourth dielectric layer 27 may not be flat or planar. For example, at a position corresponding to the position $P_1$ shown in FIG. 1, the top surface of the fourth dielectric layer 27 is at a higher level due to the existence of the first redistribution layer 22, the second redistribution layer 24 and the third redistribution layer 26. In contrast, at a position corresponding to the position $P_2$ shown in FIG. 1, the top surface of the fourth dielectric layer 27 is at a lower level due to the absent of the second redistribution 24 and the third redistribution layer 26. In some embodiments, due to the absent of two redistribution layers (e.g., the second redistribution layer 24 and the third redistribution layer 26) at the second position $P_2$, a level difference of the top surface of the fourth dielectric layer 27 between the position corresponding to the first positon $P_1$ and the position corresponding to the second position $P_2$ may be about 4 µm.

The fourth redistribution layer 28 is disposed on the fourth dielectric layer 27. The fourth redistribution layer 28 may be a patterned layer that includes at least one conductive trace and at least one conductive pad. As shown in FIG. 1, the fourth redistribution layer 28 includes at least one fourth conductive via 281 extending through the fourth dielectric layer 27 to contact and electrically connect the third redistribution layer 26. In some embodiments, as shown in FIG. 1, the fourth redistribution layer 28 includes a plurality of fourth conductive vias 281. Some of the fourth conductive vias 281 are disposed on respective ones of the third conductive vias 261.

The fifth dielectric layer 29 is disposed on the fourth dielectric layer 27 and covers the fourth redistribution layer 28. The fifth dielectric layer 29 may be conformal to the fourth redistribution layer 28 and the fourth dielectric layer 27. Similarly, the "topography" of the fifth dielectric layer 29 may be ascending at a position where the first redistribution layer 22, the second redistribution layer 24, the third redistribution layer 26 and the fourth redistribution layer 28 exists, and may be descending at a position where the first redistribution layer 22, the second redistribution layer 24, the third redistribution layer 26 and/or the fourth redistribution layer 28 is omitted. Accordingly, a top surface of the fifth dielectric layer 29 may not be flat or planar. For example, at a position corresponding to the position $P_1$ shown in FIG. 1, the top surface of the fifth dielectric layer 29 is at a higher level due to the existence of the first redistribution layer 22, the second redistribution layer 24, the third redistribution layer 26 and the fourth redistribution layer 28. In contrast, at a position corresponding to the position $P_2$ shown in FIG. 1, the top surface of the fifth dielectric layer 29 is at a lower level due to the absent of the second redistribution 24 and the third redistribution layer 26. In some embodiments, due to the absent of two redistribution layers (e.g., the second redistribution layer 24 and the third redistribution layer 26) at the second position $P_2$, a level difference of the top surface of the fourth dielectric layer 27 at a position corresponding to the first positon $P_1$ and a position corresponding to the second position $P_2$ may be about 4 µm or greater.

In some embodiments, a material of the first dielectric layer 21, the second dielectric layer 23, the third dielectric layer 25, the fourth dielectric layer 27 and/or the fifth dielectric layer 29 may include an insulating material, a passivation material, a dielectric material or a solder resist material, such as, for example, a benzocyclobutene (BCB) based polymer or a polyimide (PI). In some embodiments, the second dielectric layer 23, the third dielectric layer 25, the fourth dielectric layer 27 and/or the fifth dielectric layer 29 may be made of a photoimageable dielectric (PID) material.

In some embodiments, a material of the first redistribution layer 22, the second redistribution layer 24, the third redistribution layer 26 and/or the fourth redistribution layer 28 may be a conductive metal. For example, the first redistribution layer 22, the second redistribution layer 24, the third redistribution layer 26 and/or the fourth redistribution layer 28 may include a seed layer and a conductive layer. A material of the seed layer may be titanium, copper, another metal or an alloy. In some embodiments, the seed layer includes a titanium layer and a copper layer. A material of the conductive layer may include, for example, copper, another conductive metal, or an alloy thereof.

The wiring structure 2 has a first surface 201 and a second surface 202 opposite to the first surface 201. As shown in FIG. 1, the first surface 201 may be a bottom surface of the wiring structure 2, and the second surface 202 may be a top surface of the wiring structure 2. For example, the first surface 201 may be a bottom surface of the first dielectric layer 21, and the second surface 202 may be a top surface of the fifth dielectric layer 29. The first surface 201 may be substantially flat or planar, while the second surface 202 may not be flat or planar.

As discussed above, the second redistribution layer 24 and the third redistribution layer 26 are absent at a position corresponding to the second position $P_2$. That is, an amount of redistribution layers at a position corresponding to the first position $P_1$ is greater than an amount of redistribution layers at the second position $P_2$. For example, as shown in FIG. 1, the amount of redistribution layers at the position corresponding to the first position $P_1$ is four (e.g., including the first redistribution layer 22, the second redistribution layer 24, the third redistribution layer 26 and the fourth redistribution layer 28), and an amount of redistribution layers at the position corresponding to the second position $P_2$ is only two (e.g., including the first redistribution layer 22 and the fourth redistribution layer 28). Due to the absent of the second redistribution layer 24 and the third redistribution layer 26 at the position corresponding to the second position $P_2$, a thickness $T_1$ of the wiring structure 2 at the position corresponding to the first position $P_1$ is greater than a thickness $T_2$ of the wiring structure 2 at the position corresponding to the second position $P_2$. In some embodiments, the thickness $T_1$ of the wiring structure 2 at the position corresponding to the first position $P_1$ is greater than the thickness $T_2$ of the wiring structure 2 at the position corresponding to the second position $P_2$ by at least about 4 μm.

As shown in FIG. 1, the compensate structure includes an intermediate bump 34. The intermediate bump 34 is bonded to and electrically connected to the wiring structure 2. As shown in FIG. 1, the intermediate bump 34 is disposed at the position corresponding to the second positon $P_2$ of the wiring structure 2. As described above, thickness $T_1$ of the wiring structure 2 at the position corresponding to the first position $P_1$ is greater than a thickness $T_2$ of the wiring structure 2 at the position corresponding to the second position $P_2$. Accordingly, the compensate structure (e.g., the intermediate bump 34) is utilized to compensate the thickness difference between the thickness $T_1$ and the thickness $T_2$.

The first bump pad 31 and the second bump pad 32 are bonded to and electrically connected to the wiring structure 2. As shown in FIG. 1, the first bump pad 31 and the second bump pad 32 are respectively disposed at the position corresponding to the first position $P_1$ and the position corresponding to the second positon $P_2$ of the wiring structure 2. Accordingly, an amount of redistribution layers (e.g., including the first redistribution layer 22, the second redistribution layer 24, the third redistribution layer 26 and the fourth redistribution layer 28) disposed under the first bump pad 31 is greater than an amount of redistribution layers (e.g., including the first redistribution layer 22 and the fourth redistribution layer 28) disposed under the second bump pad 32.

In some embodiments, the first bump pad 31 and the second bump pad 32 are formed concurrently. It is difficult to form the first bump pad 31 and the second bump pad 32 with different thicknesses. That is, a thickness of the first bump pad 31 may substantially equal to a thickness of the second bump pad 32. The thickness of the first bump pad 31 may be measured from the second surface 202 of the wiring structure 2 to a top surface of the first bump pad 31. Besides, a barrier layer 35 and a wetting layer 36 may be disposed on the first bump pad 31 and the second bump pad 32. A material of the barrier layer 35 may include nickel. A material of the wetting layer 36 may include gold.

The compensation structure (e.g., the intermediate bump 34) is disposed under the second bump pad 32. The intermediate bump 34 is interposed between and electrically connecting the wiring structure 2 and the second bump pad 32. A lateral surface 341 of the intermediate bump 34 may be not coplanar with a lateral surface 321 of the second bump pad 32. A width $W_2$ of the intermediate bump 34 may be greater than a width $W_1$ of the second bump pad 32.

Due to the arrangement of the intermediate bump 34, the first bump pad 31 and the second bump pad 32 are substantially at a same level. In some embodiments, the level of the first bump pad 31 may be measured from the first surface 201 of the wiring structure 2 to the top surface of the first bump pad 31. The level of the second bump pad 32 may be measured from the first surface 201 of the wiring structure 2 to a center of a top surface of the second bump pad 32. However, the top surface of the first bump pad 31 may not be coplanar with the top surface of the second bump pad 32.

In some embodiments, as shown in FIG. 1, the second conductive via 241, the third conductive via 261 and the fourth conductive via 281 are stacked together to improve signal transmitting efficiency, and reduce signal loss. However, since the second conductive via 241, the third conductive via 261 and the fourth conductive via 281 may expand in subsequent thermal processes, the first bump pad 31 and the second bump pad 32 may not be disposed directly above the second conductive via 241, the third conductive via 261 and the fourth conductive via 281. That is, the first bump pad 31 and the second bump pad 32 may be misaligned with the second conductive via 241, the third conductive via 261 and the fourth conductive via 281.

Figure 2:
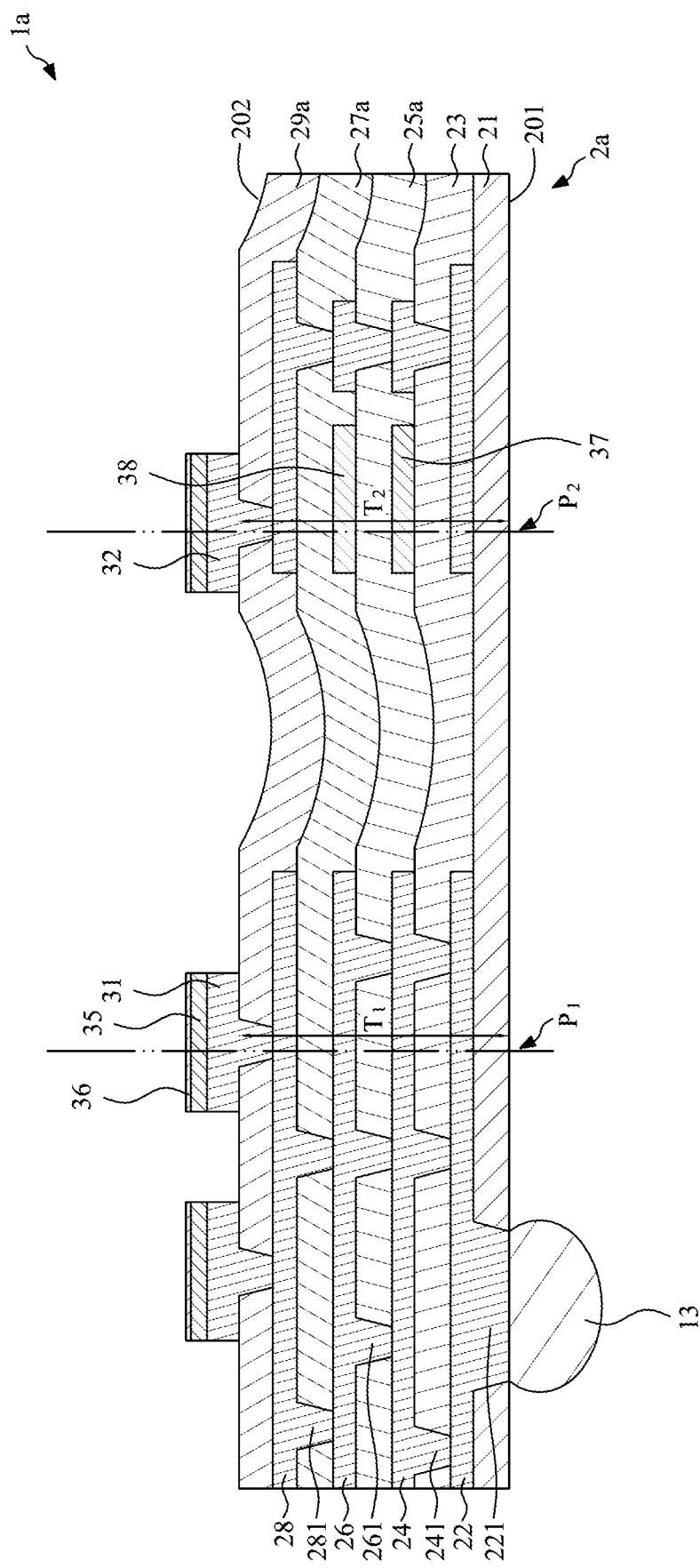
FIG. 2 illustrates a cross-sectional view of an example of a substrate structure according to some embodiments of the present disclosure.

FIG. 2 illustrates a cross-sectional view of a substrate structure 1a according to some embodiments of the present disclosure. The substrate structure 1a is similar to the substrate structure 1 shown in FIG. 1, except that the compensation structure of the substrate structure 1a includes at least one dummy metal layer (e.g., a first dummy metal layer 37 and a second dummy metal layer 38) instead of the intermediate bump 34 of the substrate structure 1.

As shown in FIG. 2, the compensation structure includes a first dummy metal layer 37 and a second dummy metal layer 38 embedded in the wiring structure 2. As described in the substrate structure 1 shown in FIG. 1, since the second redistribution layer 24 and the third redistribution layer 26 are omitted at the position corresponding to the position $P_2$, the thickness $T_2$ of the wiring structure 2 at the position corresponding to the positon $P_2$ is less than the thickness $T_1$ of the wiring structure 2 at the position corresponding to the positon $P_1$. Hence, in the substrate 1a shown in FIG. 2, the first dummy metal layer 37 and the second dummy metal layer 38 are disposed to compensate the omitted second redistribution layer 24 and third redistribution layer 26 at the position corresponding to the position $P_2$. The "dummy metal layer" provides merely for supporting purpose, without any electrical connection function. For example, the first dummy metal layer 37 and the second dummy metal layer 38 are insulated from the redistribution layers of the wiring structure 2, such as the first redistribution layer 22, the second redistribution layer 24, the third redistribution layer 26 and the fourth redistribution layer 28.

The first dummy metal layer 37 and the second dummy metal layer 38 are disposed at the position corresponding to the position $P_2$ under the second bump pad 32. As shown in FIG. 2, the first dummy metal layer 37 is disposed on the second dielectric layer 23. In some embodiments, the first dummy metal layer 37 may be formed concurrently with the second redistribution layer 24. The second dummy metal layer 38 is disposed on the third dielectric layer 25a. In some embodiments, the second dummy metal layer 38 may be formed concurrently with the third redistribution layer 26. Due to the arrangement of the first dummy metal layer 37 and the second dummy metal layer 38, the third dielectric layer 25a, the fourth dielectric layer 27a and the fifth dielectric layer 29a may not be descending at the position corresponding to the positon $P_2$. The thickness $T_2$ of the wiring structure 2 at the position corresponding to the positon $P_2$ may thus be substantially equal to the thickness $T_1$ of the wiring structure 2 at the position corresponding to the positon $P_1$. Accordingly, the first bump pad 31 and the second bump pad 32 are substantially at a same level. In some embodiments, the first dummy metal layer 37 may include a plurality of metal blocks, and the metal blocks may be separated from each other by a plurality of gaps. Similarly, the second dummy metal layer 38 may also include a plurality of metal blocks, and the metal blocks may be separated from each other by a plurality of gaps.

Figure 3:
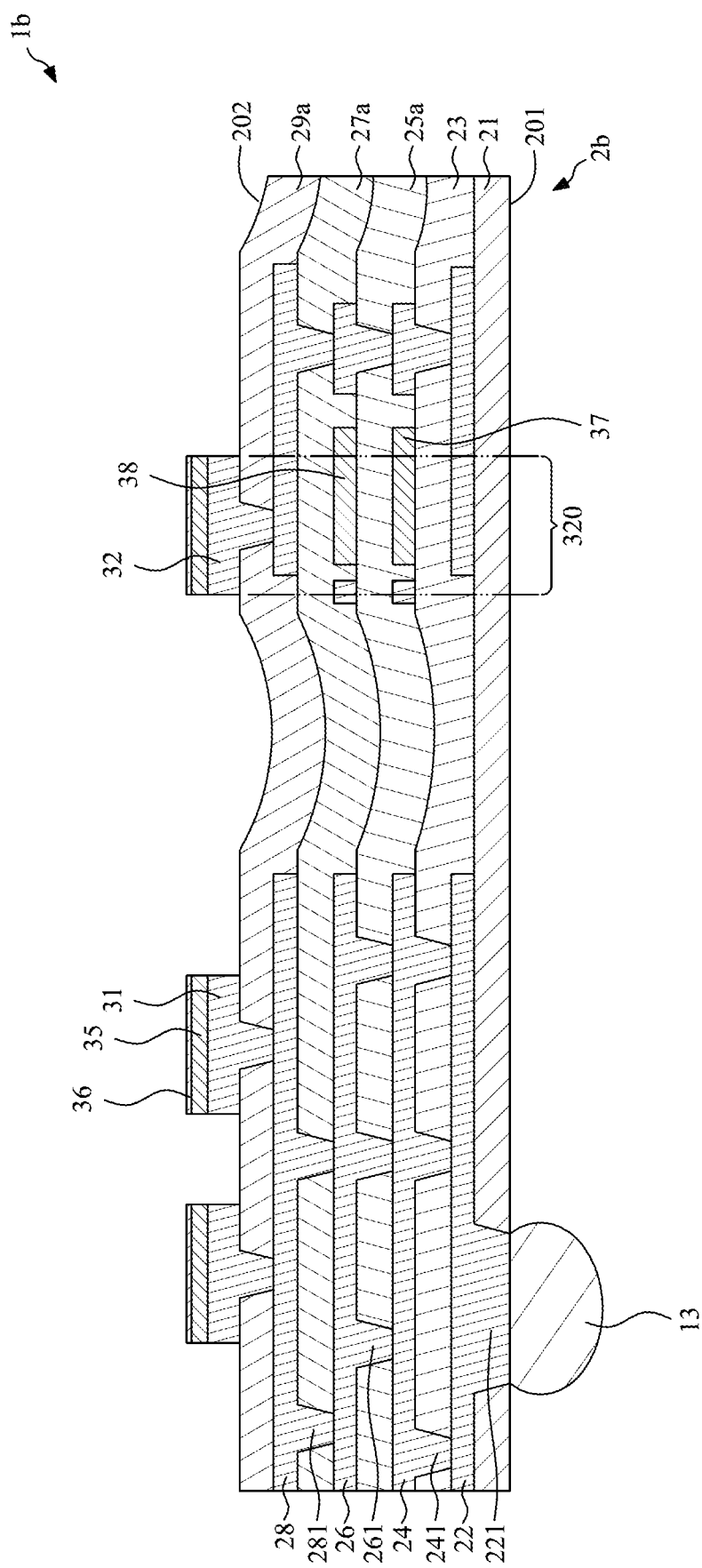
FIG. 3 illustrates a cross-sectional view of an example of a substrate structure according to some embodiments of the present disclosure.

FIG. 3 illustrates a cross-sectional view of a substrate structure 1b according to some embodiments of the present disclosure. The substrate structure 1b is similar to the substrate structure 1a shown in FIG. 2, except that the second redistribution layer 24 and/or the third redistribution layer 26 is not completely omitted under the second bump pad 32.

As shown in FIG. 3, the second bump pad 32 has a projection region 320 on the second dielectric layer 23. The projection region 320 of the second bump pad 32 has a first area. A portion of the second redistribution layer 24 is disposed within the projection region of the second bump pad 32. The portion of the second redistribution layer 24 in the projection region 320 has a second area. The second area is less than 40% of the first area. That is, an area of a portion of the second redistribution layer 24 within a projection region 320 of the second bump pad 32 on the second dielectric layer 23 is less than 40% of an area of the projection region 320 of the second bump pad 32 on the second dielectric layer 23. In this case, the first dummy metal layer 37 is necessary for supporting purpose. That is, the present disclosure further provides a design rule for dummy metal layers. When an area of a portion of the redistribution layer within a projection region of the bump pad on the dielectric layer is less than 40% of an area of the projection region of the bump pad on the dielectric layer, a dummy metal layer may be disposed on the dielectric layer for supporting purpose. As shown in FIG. 3, the first dummy metal layer 37 is disposed on the second dielectric layer 23. At least a portion of the first dummy metal layer 37 is disposed within the projection region 320 of the second bump pad 32 on the second dielectric layer 23.

Besides, the aforementioned design rule for dummy metal layers may be applied to each redistribution layer under the bump pad. For example, the second bump pad 32 has a projection region 320 on the third dielectric layer 25a. The projection region 320 of the second bump pad 32 has a first area. A portion of the third redistribution layer 26 is disposed within the projection region 320 of the bump pad 32. The portion of the third redistribution layer 26 in the projection region 320 has a second area. The second area is less than 40% of the first area. That is, as for the third redistribution layer 26, an area of a portion of the third redistribution layer 26 within the projection region 320 of the second bump pad 32 on the third dielectric layer 25a is less than 40% of an area of the projection region 320 of the second bump pad 32 on the third dielectric layer 25a. Accordingly, the second dummy metal layer 38 is disposed on the third dielectric layer 25a for supporting purpose. As shown in FIG. 3, the second dummy metal layer 38 is disposed on the third dielectric layer 25a, wherein at least a portion of the second dummy metal layer 38 is disposed within the projection region 320 of the bump pad 32 on the third dielectric layer 25a.

Figure 4:
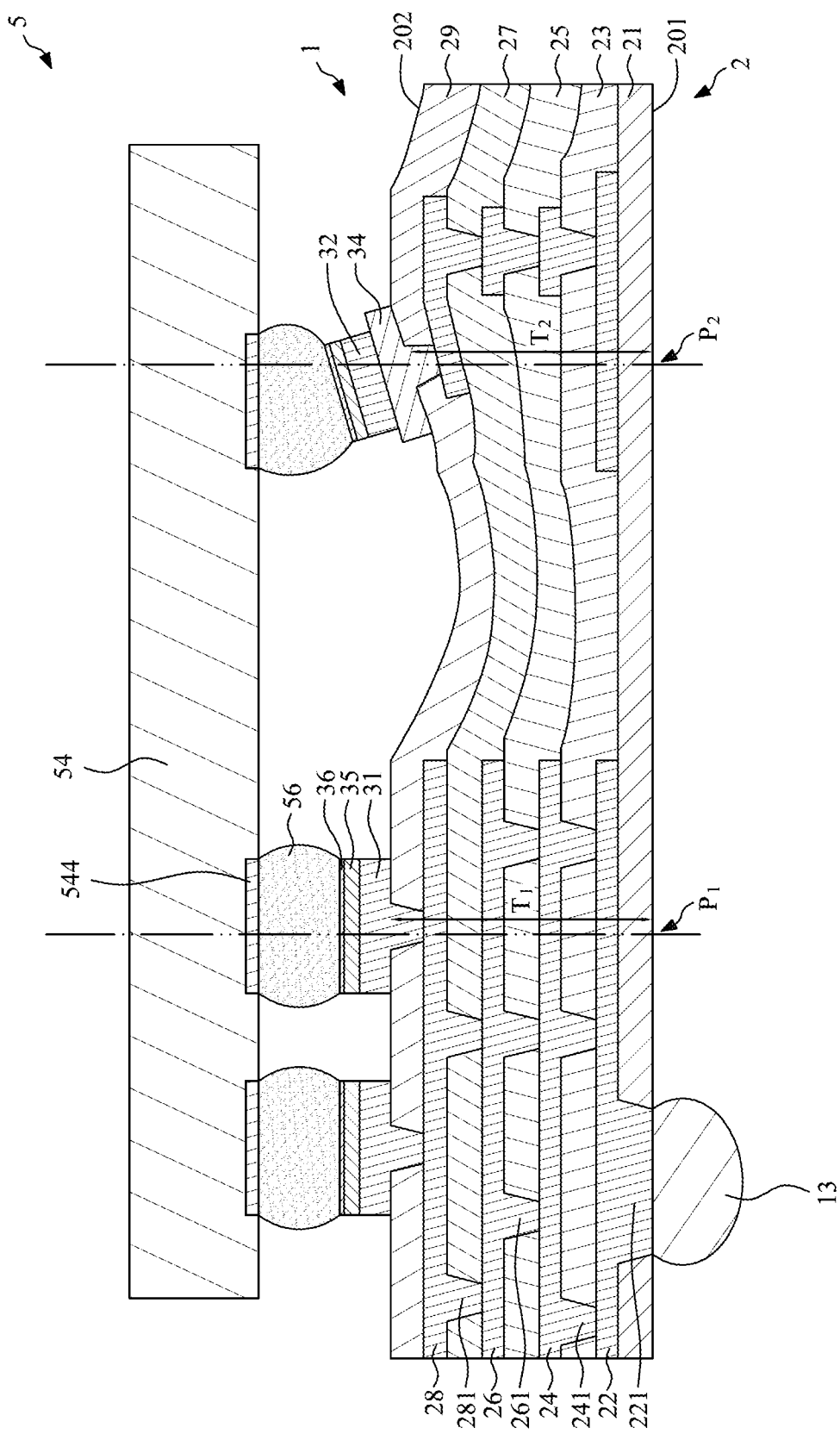
FIG. 4 illustrates a cross-sectional view of an example of a semiconductor device according to some embodiments of the present disclosure.

FIG. 4 illustrates a cross-sectional view of a semiconductor device 5 according to some embodiments of the present disclosure. The semiconductor device 5 includes the substrate structure 1 shown in FIG. 1, and further includes a semiconductor die 54 electrically connected to the first bump pad 31 and the second bump pad 32.

As shown in FIG. 4, the semiconductor die 54 may include a plurality of bump pads 544. Each of the bump pad 544 of the semiconductor die 54 is connected to a respective one of the first bump pad 31 and the second bump pad 32 of the substrate structure 1 through a solder ball 56 disposed therebetween. Since the first bump pad 31 and the second bump pad 32 are substantially at a same level, the semiconductor die 54 may be properly connected to the substrate structure 1. A top surface of the semiconductor die 54 may thus be substantially coplanar with a bottom surface (e.g., the first surface 201) of the wiring structure 2.

FIG. 5 through FIG. 16 illustrate a method for manufacturing a substrate structure according to some embodiments of the present disclosure. In some embodiments, the method is for manufacturing a substrate structure, such as the substrate structure 1 shown in FIG. 1.

Figure 5:
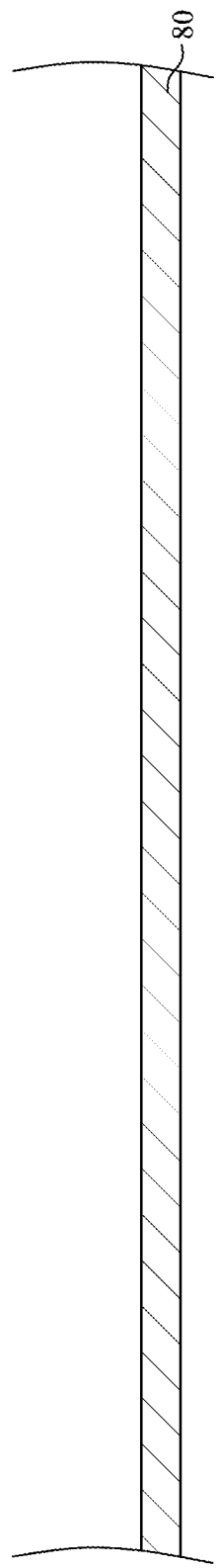
FIG. 5 illustrates one or more stages of an example of a method for manufacturing a substrate structure according to some embodiments of the present disclosure.

Referring to FIG. 5, a carrier 80 is provided.

Figure 6:
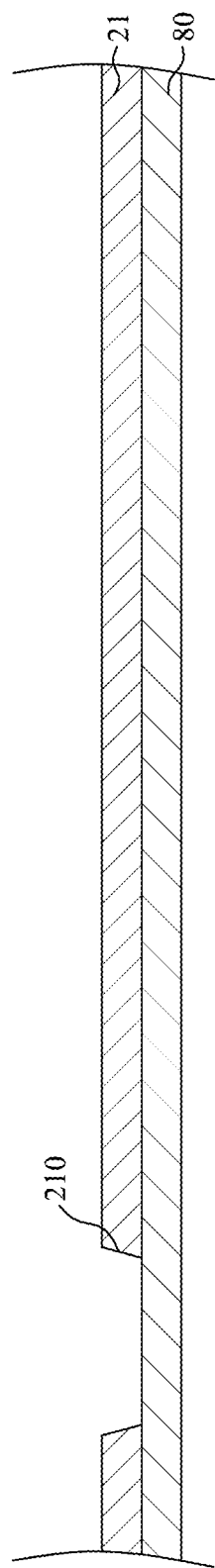
FIG. 6 illustrates one or more stages of an example of a method for manufacturing a substrate structure according to some embodiments of the present disclosure.

Referring to FIG. 6, a first dielectric layer 21 is formed or disposed on the carrier 80. The first dielectric layer 21 defines a through hole 210 to expose a portion of the carrier 80. The through hole 210 may be formed by mechanical drilling, laser drilling, or lithographic techniques.

Figure 7:
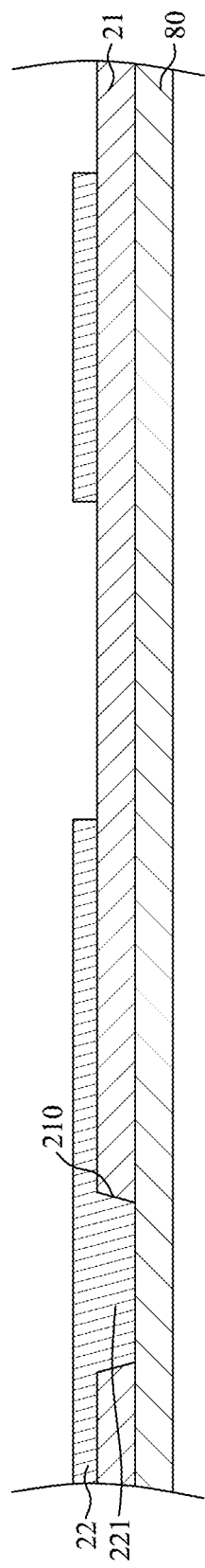
FIG. 7 illustrates one or more stages of an example of a method for manufacturing a substrate structure according to some embodiments of the present disclosure.

Referring to FIG. 7, a first redistribution layer 22 is formed or disposed on the first dielectric layer 21 by, for example, plating. The first redistribution layer 22 includes at least one first conductive via 221 extending in the through hole 210 through the first dielectric layer 21 to form an external contact. The first redistribution layer 22 may be a patterned layer.

Figure 8:
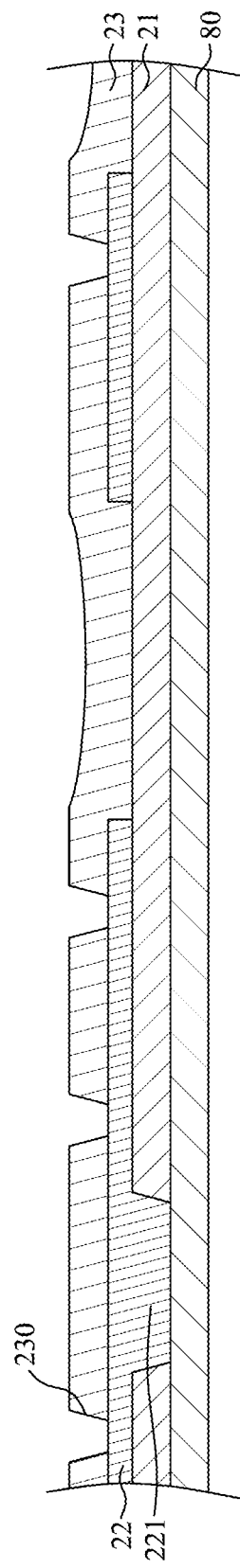
FIG. 8 illustrates one or more stages of an example of a method for manufacturing a substrate structure according to some embodiments of the present disclosure.

Referring to FIG. 8, a second dielectric layer 23 is formed or disposed on the first dielectric layer 21 to cover the first redistribution layer 22. The second dielectric layer 23 may be conformal to the first redistribution layer 22. For example, the second dielectric layer 23 may be applied in a liquid form by coating, or in a dry film form by laminating. The second dielectric layer 23 may be applied in a constant volume over the entire first dielectric layer 21 to cover the first redistribution layer 22. Hence, the "topography" of the second dielectric layer 23 may be affected by the first redistribution layer 22 disposed thereunder. That is, the "topography" of the second dielectric layer 23 may be ascending at a position where the first redistribution layer 22 exists, and may be descending at a position where the first redistribution layer 22 is absent. Accordingly, a top surface of the second dielectric layer 23 may not be flat or planar. The second dielectric layer 23 defines at least one through hole 230 to expose a portion of the first redistribution layer 22.

Figure 9:
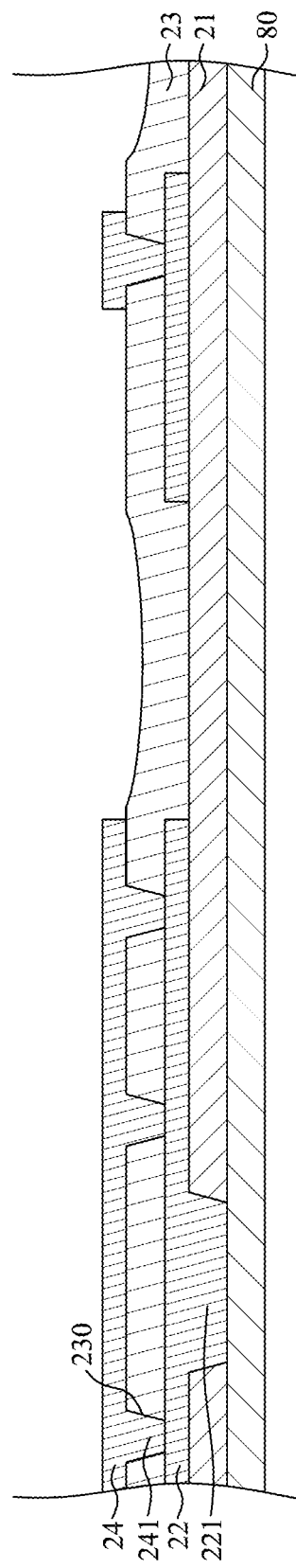
FIG. 9 illustrates one or more stages of an example of a method for manufacturing a substrate structure according to some embodiments of the present disclosure.

Referring to FIG. 9, a second redistribution layer 24 is formed or disposed on the second dielectric layer 23 by, for example, plating. The second redistribution layer 24 includes at least one second conductive via 241 extending in the though hole 230 through the second dielectric layer 23 to contact and electrically connect the first redistribution layer 22. In some embodiments, as shown in FIG. 9, the second redistribution layer 24 includes a plurality of second conductive vias 241. The second redistribution layer 24 may be a patterned layer.

Figure 10:
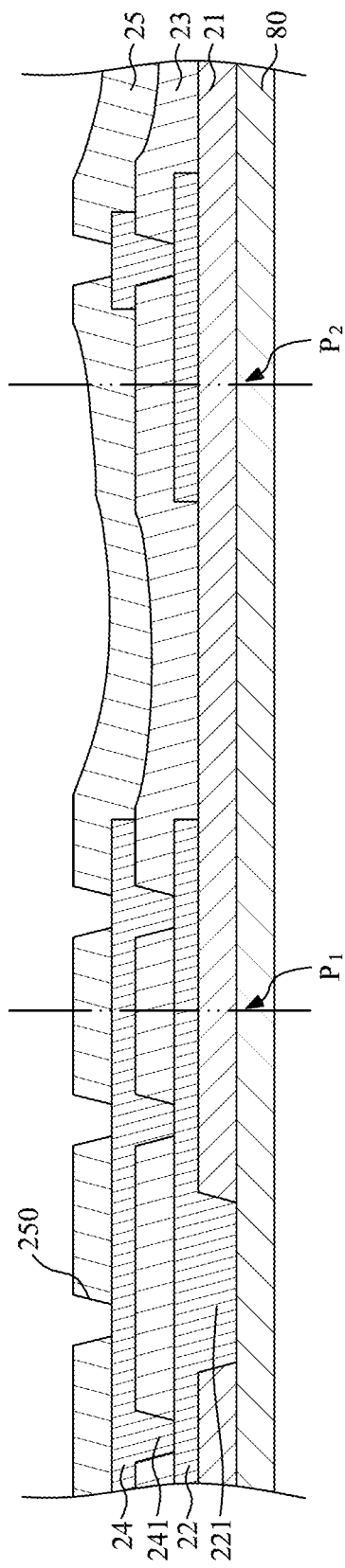
FIG. 10 illustrates one or more stages of an example of a method for manufacturing a substrate structure according to some embodiments of the present disclosure.

Referring to FIG. 10, a third dielectric layer 25 is formed or disposed on the second dielectric layer 23 to cover the second redistribution layer 24. The third dielectric layer 25 may be conformal to the second redistribution layer 24 and the second dielectric layer 23. Similar to the second dielectric layer 23 described above, the "topography" of the third dielectric layer 25 may be ascending at a position where the first redistribution layer 22 and second redistribution layer 24 exist, and may be descending at a position where the first redistribution layer 22 and/or the second redistribution layer 24 is omitted. Accordingly, a top surface of the third dielectric layer 25 may not be flat or planar. For example, at a position corresponding to the position $P_1$ shown in FIG. 1, the top surface of the third dielectric layer 25 is at a higher level due to the existence of the second redistribution layer 24. In contrast, at a position corresponding to the position $P_2$ shown in FIG. 10, the top surface of the third dielectric layer 25 is at a lower level due to the absent of the second redistribution 24. In some embodiments, a level difference of the top surface of the third dielectric layer 25 between the position corresponding to the first positon $P_1$ and the position corresponding to the second position $P_2$ may be about 2 The third dielectric layer 25 defines at least one through hole 250 to expose a portion of the second redistribution layer 24. In some embodiments, the third dielectric layer 25 defines a plurality of through holes 250, and some of the through holes 250 expose respective ones of the second conductive vias 241.

Figure 11:
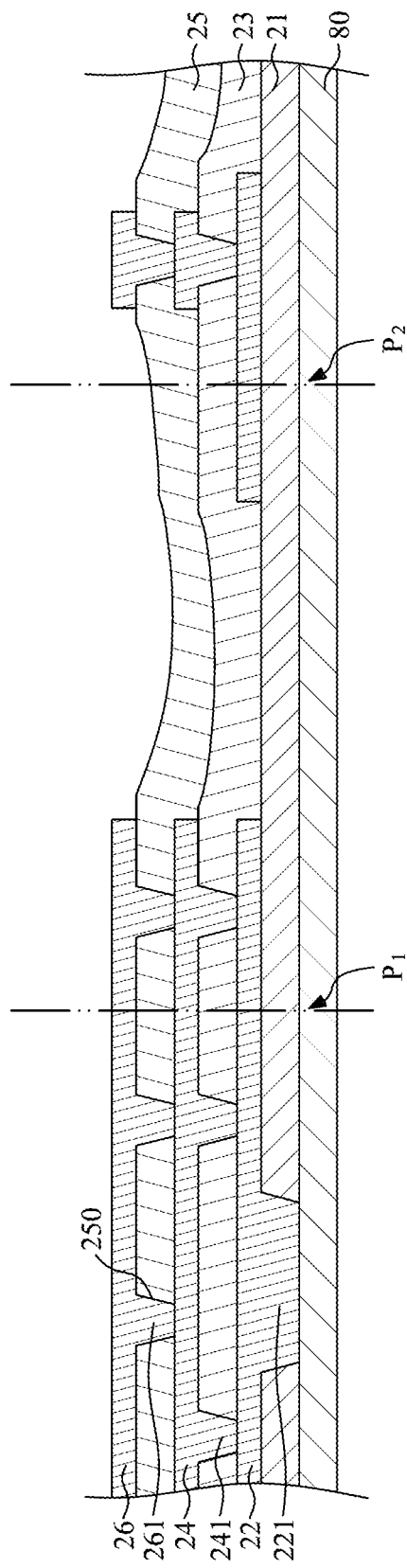
FIG. 11 illustrates one or more stages of an example of a method for manufacturing a substrate structure according to some embodiments of the present disclosure.

Referring to FIG. 11, a third redistribution layer 26 is formed or disposed on the third dielectric layer 25 by, for example, plating. The third redistribution layer 26 includes at least one third conductive via 261 extending in the though hole 250 through the third dielectric layer 25 to contact and electrically connect the second redistribution layer 24. In some embodiments, as shown in FIG. 11, the third redistribution layer 26 includes a plurality of third conductive vias 261. Some of the third conductive vias 261 are disposed on respective ones of the second conductive vias 241. The third redistribution layer 26 may be a patterned layer.

Figure 12:
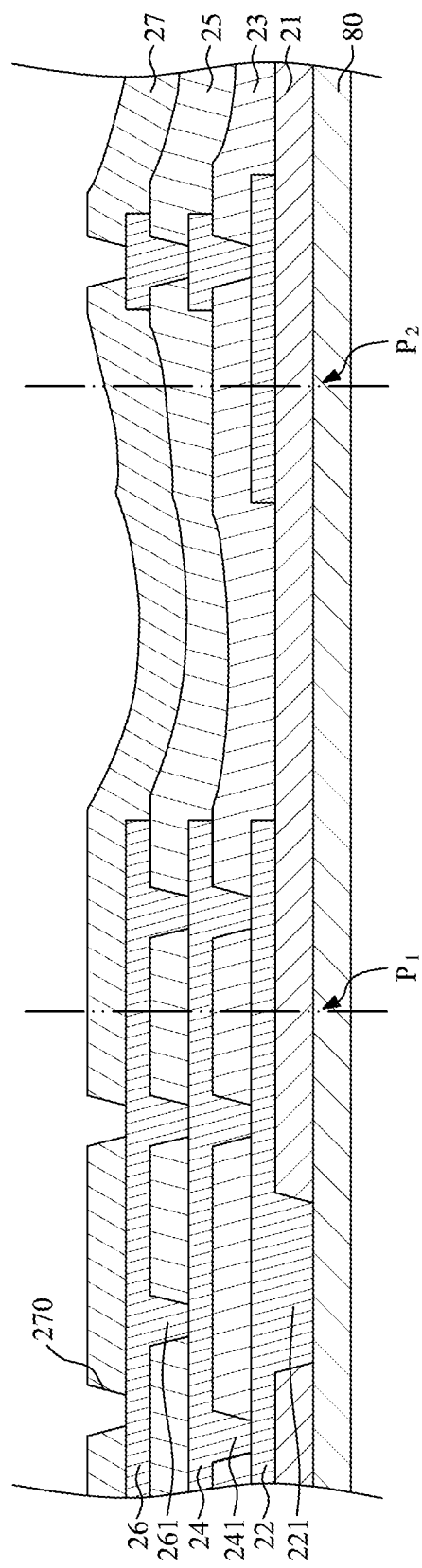
FIG. 12 illustrates one or more stages of an example of a method for manufacturing a substrate structure according to some embodiments of the present disclosure.

Referring to FIG. 12, a fourth dielectric layer 27 is formed or disposed on the third dielectric layer 25 to cover the third redistribution layer 26. The fourth dielectric layer 27 may be conformal to the third redistribution layer 26 and the third dielectric layer 25. Similar to the second dielectric layer 23 and the third dielectric layer 25 described above, the "topography" of the fourth dielectric layer 27 may be ascending at a position where the first redistribution layer 22, the second redistribution layer 24 and the third redistribution layer 26 exist, and may be descending at a position where the first redistribution layer 22, the second redistribution layer 24 and/or the third redistribution layer 26 is omitted. Accordingly, a top surface of the fourth dielectric layer 27 may not be flat or planar. For example, at a position corresponding to the position $P_1$ shown in FIG. 1, the top surface of the fourth dielectric layer 27 is at a higher level due to the existence of the first redistribution layer 22, the second redistribution layer 24 and the third redistribution layer 26. In contrast, at a position corresponding to the position $P_2$ shown in FIG. 12, the top surface of the fourth dielectric layer 27 is at a lower level due to the absent of the second redistribution 24 and the third redistribution layer 26. In some embodiments, due to the absent of two redistribution layers (e.g., the second redistribution layer 24 and the third redistribution layer 26) at the second position $P_2$, a level difference of the top surface of the fourth dielectric layer 27 between the position corresponding to the first positon $P_1$ and the position corresponding to the second position $P_2$ may be about 4 The fourth dielectric layer 27 defines at least one through hole 270 to expose a portion of the third redistribution layer 26. In some embodiments, the fourth dielectric layer 27 defines a plurality of through holes 270, and some of the through holes 270 expose respective ones of the third conductive vias 261.

Figure 13:
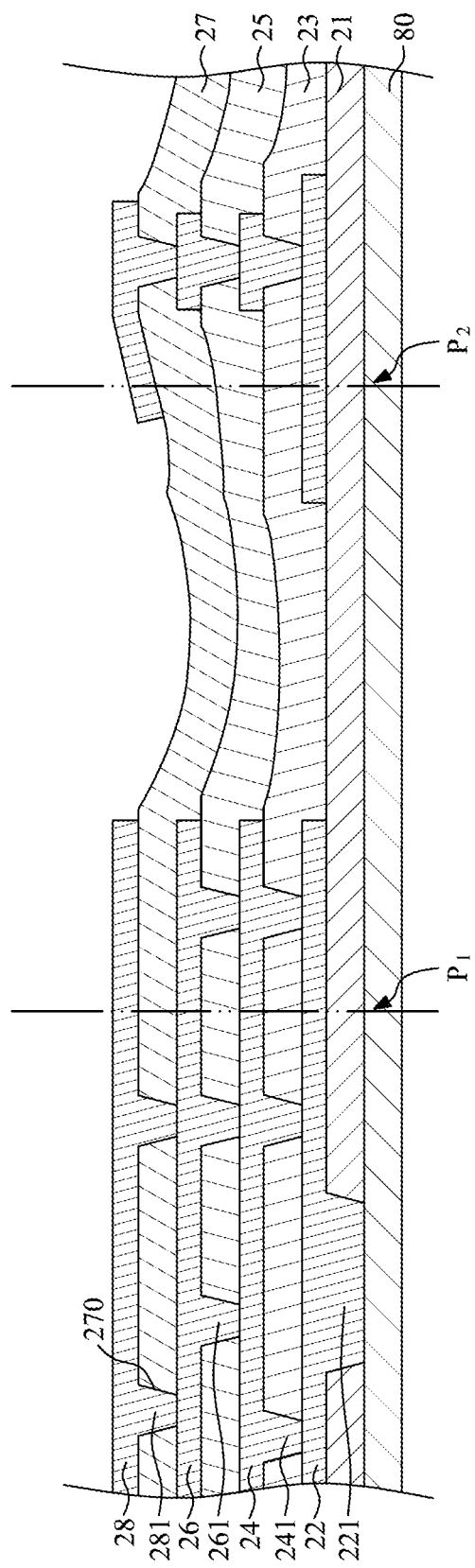
FIG. 13 illustrates one or more stages of an example of a method for manufacturing a substrate structure according to some embodiments of the present disclosure.

Referring to FIG. 13, a fourth redistribution layer 28 is formed or disposed on the fourth dielectric layer 27 by, for example, plating. The fourth redistribution layer 28 includes at least one fourth conductive via 281 extending in the through hole 270 through the fourth dielectric layer 27 to contact and electrically connect the third redistribution layer 26. In some embodiments, as shown in FIG. 13, the fourth redistribution layer 28 includes a plurality of fourth conductive vias 281. Some of the fourth conductive vias 281 are disposed on respective ones of the third conductive vias 261. The fourth redistribution layer 28 may be a patterned layer.

Figure 14:
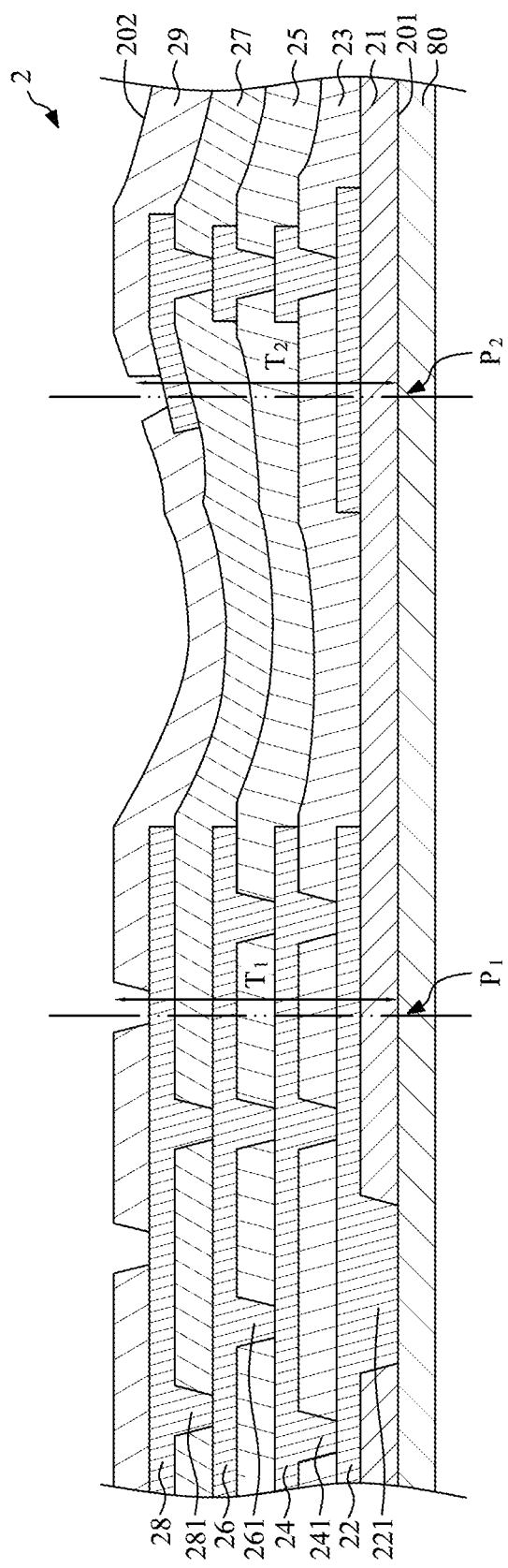
FIG. 14 illustrates one or more stages of an example of a method for manufacturing a substrate structure according to some embodiments of the present disclosure.

Referring to FIG. 14, the fifth dielectric layer 29 is formed or disposed on the fourth dielectric layer 27 to cover the fourth redistribution layer 28, thus forming a wiring structure 2. The fifth dielectric layer 29 may be conformal to the fourth redistribution layer 28 and the fourth dielectric layer 27. Similarly, the "topography" of the fifth dielectric layer 29 may be ascending at a position where the first redistribution layer 22, the second redistribution layer 24, the third redistribution layer 26 and the fourth redistribution layer 28 exists, and may be descending at a position where the first redistribution layer 22, the second redistribution layer 24, the third redistribution layer 26 and/or the fourth redistribution layer 28 is omitted. Accordingly, a top surface of the fifth dielectric layer 29 may not be flat or planar. For example, at a position corresponding to the position $P_1$ shown in FIG. 14, the top surface of the fifth dielectric layer 29 is at a higher level due to the existence of the first redistribution layer 22, the second redistribution layer 24, the third redistribution layer 26 and the fourth redistribution layer 28. In contrast, at a position corresponding to the position $P_2$ shown in FIG. 14, the top surface of the fifth dielectric layer 29 is at a lower level due to the absent of the second redistribution 24 and the third redistribution layer 26. In some embodiments, due to the absent of two redistribution layers (e.g., the second redistribution layer 24 and the third redistribution layer 26) at the position corresponding to the second position $P_2$, a level difference of the top surface of the fourth dielectric layer 27 between the position corresponding to the first positon $P_1$ and the position corresponding to the second position $P_2$ may be about 4 µm or greater.

Meanwhile, a wiring structure 2 is obtained. The wiring structure 2 has a first surface 201 and a second surface 202 opposite to the first surface 201. As shown in FIG. 14, the first surface 201 may be a bottom surface of the wiring structure 2, and the second surface 202 may be a top surface of the wiring structure 2. For example, the first surface 201 may be a bottom surface of the first dielectric layer 21, and the second surface 202 may be a top surface of the fifth dielectric layer 29. The first surface 201 may be substantially flat or planar, while the second surface 202 may not be flat or planar.

As discussed above, the second redistribution layer 24 and the third redistribution layer 26 are absent at the position corresponding to the second position $P_2$. That is, an amount of redistribution layers at the position corresponding to the first position $P_1$ is greater than an amount of redistribution layers at the position corresponding to the second position $P_2$. For example, as shown in FIG. 14, the amount of redistribution layers at the position corresponding to the first position $P_1$ is four (e.g., including the first redistribution layer 22, the second redistribution layer 24, the third redistribution layer 26 and the fourth redistribution layer 28), and an amount of redistribution layers at the position corresponding to the second position $P_2$ is only two (e.g., including the first redistribution layer 22 and the fourth redistribution layer 28). Besides, due to the absent of the second redistribution layer 24 and the third redistribution layer 26 at the position corresponding to the second position $P_2$, a thickness $T_1$ of the wiring structure 2 at the position corresponding to the first position $P_1$ is greater than a thickness $T_2$ of the wiring structure 2 at the position corresponding to the second position $P_2$. In some embodiments, the thickness $T_1$ of the wiring structure 2 at the position corresponding to the first position $P_1$ is greater than the thickness $T_2$ of the wiring structure 2 at the position corresponding to the second position $P_2$ by at least about 4 μm.

Figure 15:
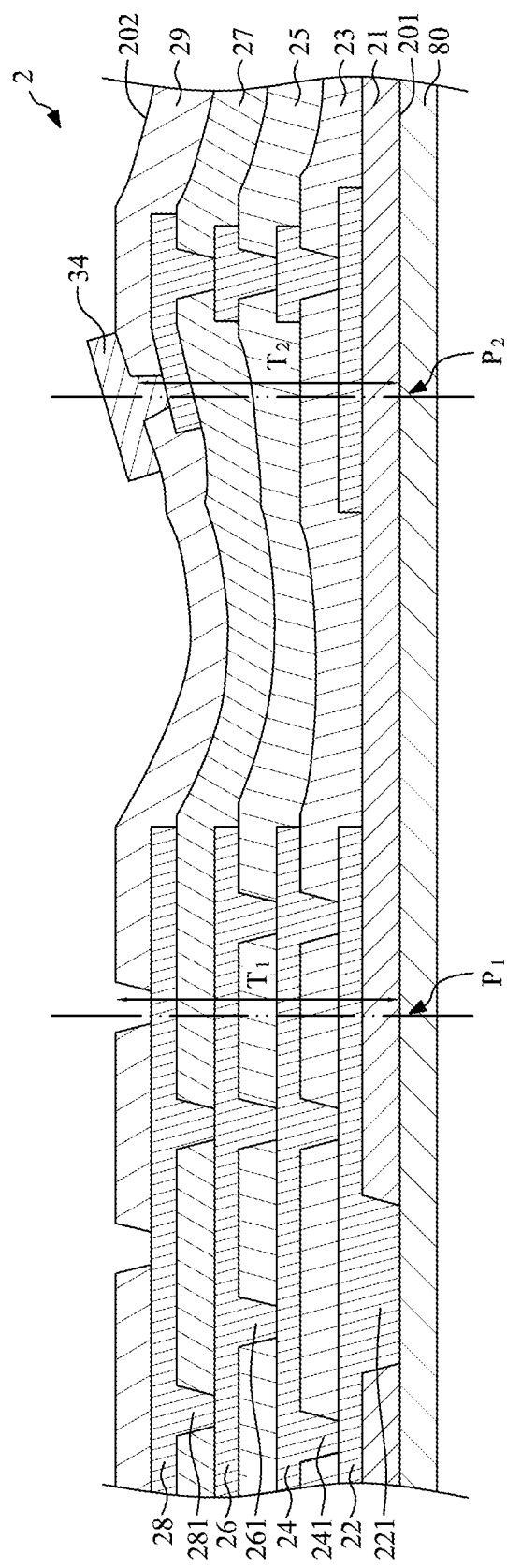
FIG. 15 illustrates one or more stages of an example of a method for manufacturing a substrate structure according to some embodiments of the present disclosure.

Referring to FIG. 15, a compensation structure, such as an intermediate bump 34, is formed on the wiring structure 2 by, for example, plating. The intermediate bump 34 is bonded to and electrically connected to the wiring structure 2. As shown in FIG. 15, the intermediate bump 34 is disposed at the position corresponding to the second positon $P_2$ of the wiring structure 2. As described above, thickness $T_1$ of the wiring structure 2 at the position corresponding to the first position $P_1$ is greater than a thickness $T_2$ of the wiring structure 2 at the position corresponding to the second position $P_2$. Accordingly, the compensate structure (e.g., the intermediate bump 34) is utilized to compensate the thickness difference between the thickness $T_1$ and the thickness $T_2$. A top portion of the intermediate bump 34 may be disposed on the second surface 202 of the wiring structure 2. A bottom portion of the intermediate bump 34 may be disposed in an opening of the fifth dielectric layer 29 to electrically connect the fourth redistribution layer 28.

Figure 16:
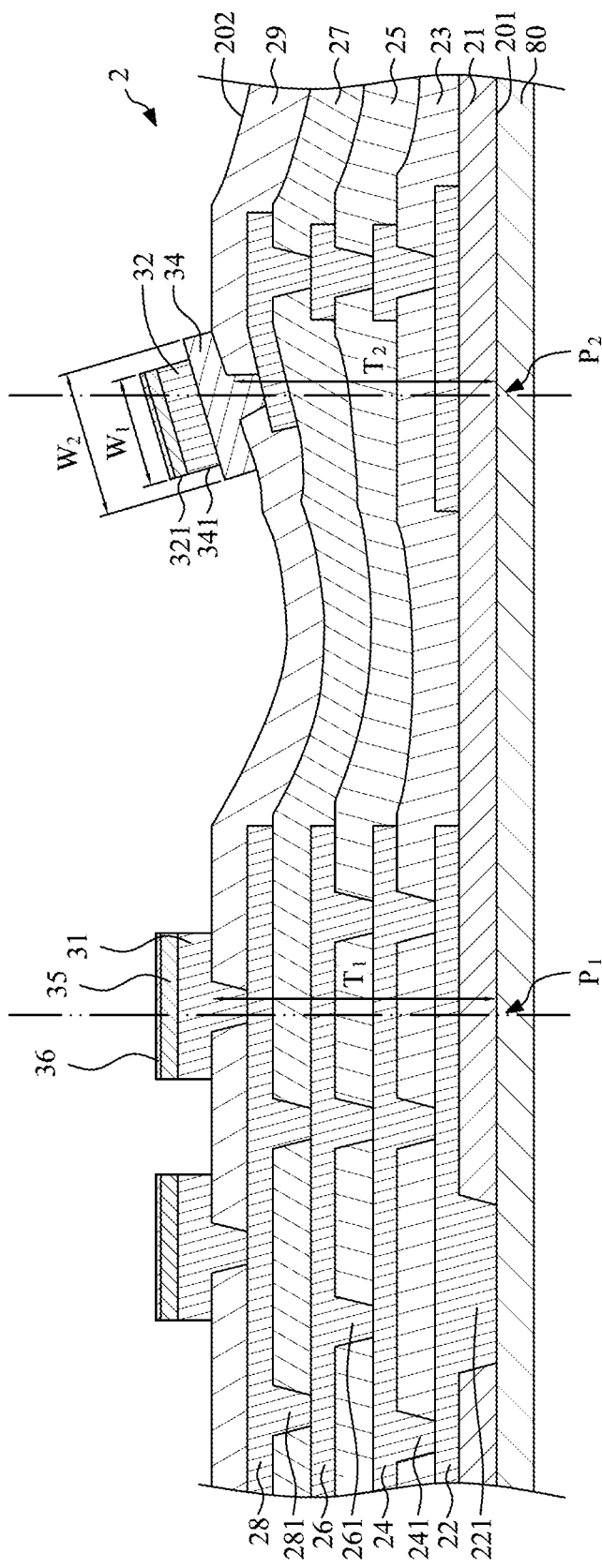
FIG. 16 illustrates one or more stages of an example of a method for manufacturing a substrate structure according to some embodiments of the present disclosure.

Referring to FIG. 16, a first bump pad 31 and a second bump pad 32 are formed on the wiring structure 2 by, for example, plating. The first bump 31 and the second bump 32 are electrically connected to the wiring structure 2. The first bump 31 and the second bump 32 are respectively located at the position corresponding to the first position $P_1$ and the position corresponding to the second position $P_2$.

The second bump pad 32 is disposed on the compensation structure (e.g., the intermediate bump 34). Thus, the intermediate bump 34 is interposed between and electrically connecting the wiring structure 2 and the second bump pad 32. A lateral surface 341 of the intermediate bump 34 may be not coplanar with a lateral surface 321 of the second bump pad 32. A width $W_2$ of the intermediate bump 34 may be greater than a width $W_1$ of the second bump pad 32.

Due to the arrangement of the intermediate bump 34, the first bump pad 31 and the second bump pad 32 are substantially at a same level. In some embodiments, the level of the first bump pad 31 may be measured from the first surface 201 of the wiring structure 2 to the top surface of the first bump pad 31. The level of the second bump pad 32 may be measured from the first surface 201 of the wiring structure 2 to a center of a top surface of the second bump pad 32. However, the top surface of the first bump pad 31 may not be coplanar with the top surface of the second bump pad 32.

Then, the carrier 80 is removed. An external connector 13 is connected to the first conductive via 221 of the first dielectric layer 21. Then, a singulation process may be conducted to the wiring structure 2, thus forming the substrate structure 1 as shown in FIG. 1.

Figure 17:
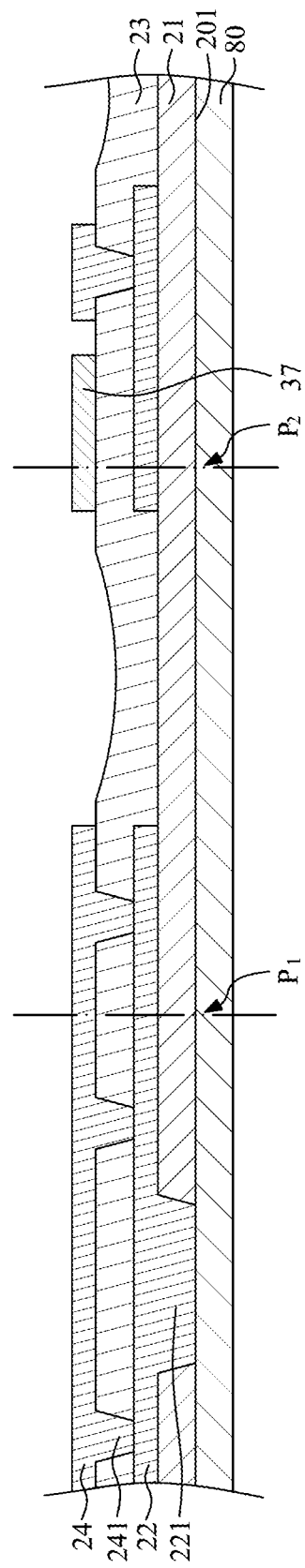
FIG. 17 illustrates one or more stages of an example of a method for manufacturing a substrate structure according to some embodiments of the present disclosure.
Figure 18:
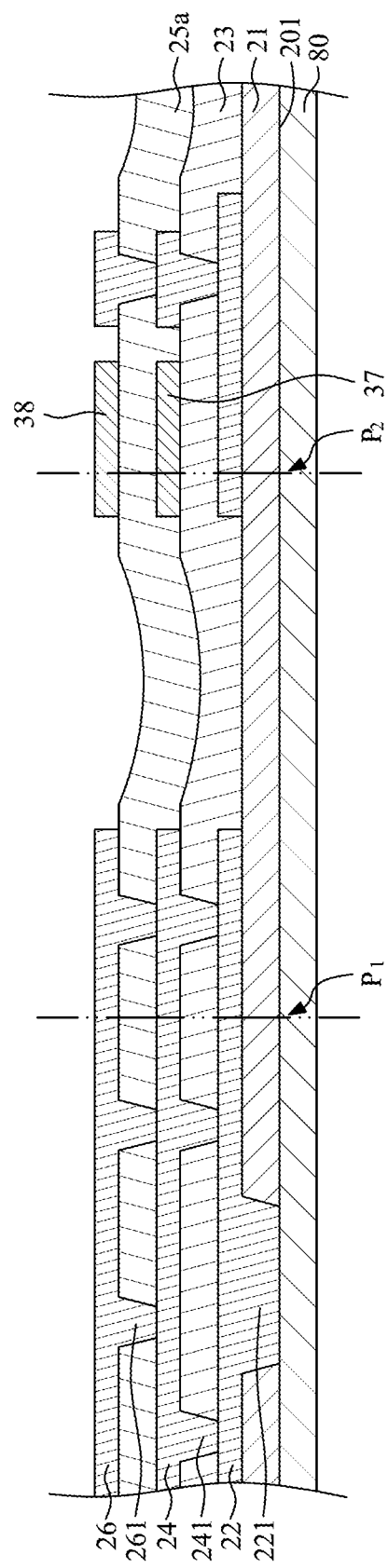
FIG. 18 illustrates one or more stages of an example of a method for manufacturing a substrate structure according to some embodiments of the present disclosure.
Figure 19:
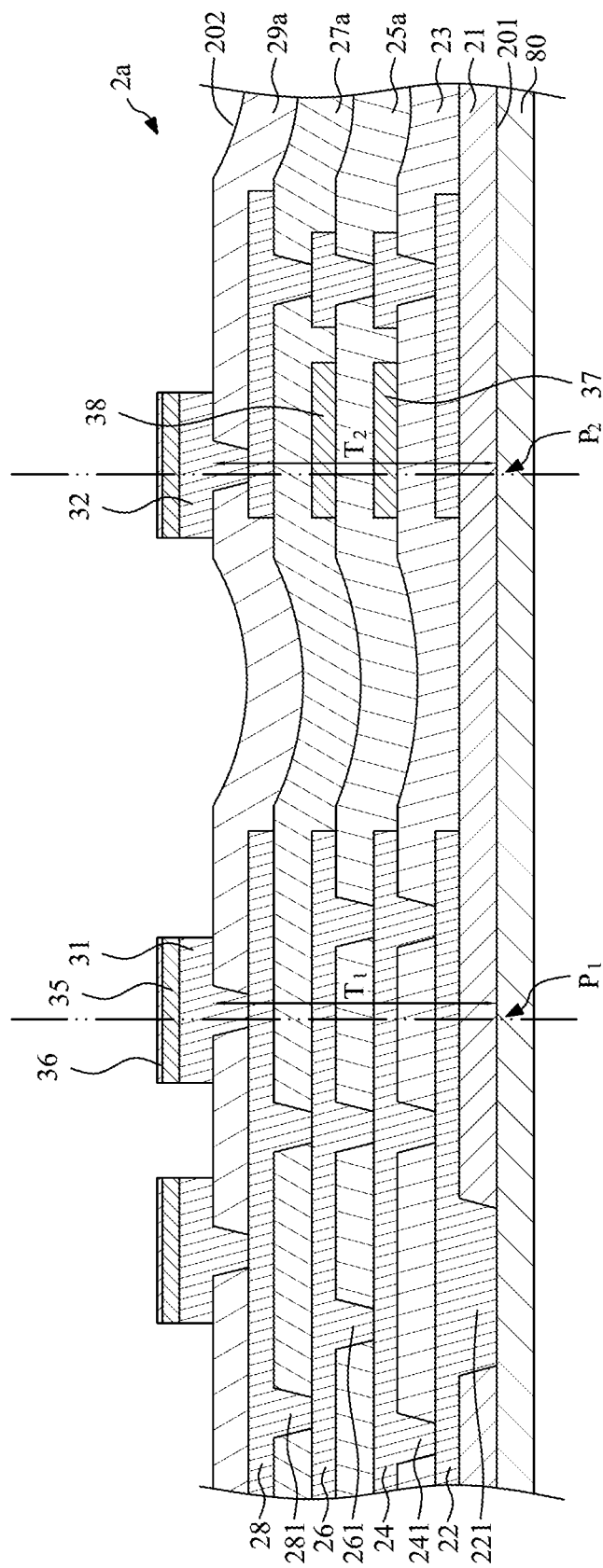
FIG. 19 illustrates one or more stages of an example of a method for manufacturing a substrate structure according to some embodiments of the present disclosure.

FIG. 17 through FIG. 19 illustrates a method for forming a substrate structure according to some embodiments of the present disclosure, such as the substrate structure 1a shown in FIG. 2. The initial stage of the illustrated process is the same as, or similar to, the stage illustrated in FIG. 5 through FIG. 8. FIG. 17 depict a stage subsequent to that depicted in FIG. 8.

Referring to FIG. 17, a second redistribution layer 24 is disposed on the second dielectric layer 23 by, for example, plating. Besides, a first dummy metal layer 37 is also formed on the second dielectric layer 23 by, for example, plating. The first dummy metal layer 37 is located at a position corresponding to the position $P_2$. In some embodiments, the first dummy metal layer 37 may be formed concurrently with the second redistribution layer 24. For example, the first dummy metal layer 37 and the second redistribution layer 24 may be formed in a same process with a same material. However, the first dummy metal layer 37 is insulated from the second redistribution layer 24.

Referring to FIG. 18, a third dielectric layer 25a is formed on the second dielectric layer 23 to cover the second redistribution layer 24 and the first dummy metal layer 37. The third dielectric layer 25a may be applied in a liquid form by coating, or in a dry film form by laminating. The third dielectric layer 25a may be conformal to the first redistribution layer 22, the second redistribution layer 24 and the first dummy metal layer 37. Due to the existence of the first dummy metal layer 37, the third dielectric layer 25a is not descending at the position corresponding to the position $P_2$.

Then, a third redistribution layer 26 is disposed on the third dielectric layer 25a by, for example, plating. Besides, a second dummy metal layer 38 is also formed on the third dielectric layer 25a by, for example, plating. The second dummy metal layer 38 is located at a position corresponding to the position $P_2$. In some embodiments, the second dummy metal layer 38 may be formed concurrently with the third redistribution layer 26. For example, the second dummy metal layer 38 and the third redistribution layer 26 may be formed in a same process with a same material. However, the second dummy metal layer 38 is insulated from the third redistribution layer 26.

Referring to FIG. 19, a fourth dielectric layer 27a is formed on the third dielectric layer 25a to cover the third redistribution layer 26 and the second dummy metal layer 38. The fourth dielectric layer 27a may be applied in a liquid form by coating, or in a dry film form by laminating. The fourth dielectric layer 27a may be conformal to the first redistribution layer 22, the second redistribution layer 24, the first dummy metal layer 37, the third redistribution layer 26 and the second dummy metal layer 38. Due to the existence of the first dummy metal layer 37 and the second dummy metal layer 38, the fourth dielectric layer 27a is not descending at the position corresponding to the position $P_2$.

Then, a fourth redistribution layer 28 and a fifth dielectric layer 29a are sequentially formed on the fourth dielectric layer 27a, thus forming a wiring structure 2a. The formation processes of the fourth redistribution layer 28 and the fifth dielectric layer 29a are similar to those of the fourth redistribution layer 28 and the fifth dielectric layer 29 described in FIGS. 13 and 14. A compensation structure (e.g., including the first dummy metal layer 37 and/or the second dummy metal layer 38) is embedded in the wiring structure 2a.

Then, a first bump pad 31 and a second bump pad 32 are formed on the wiring structure 2a by, for example, plating. The first bump 31 and the second bump 32 are electrically connected to the wiring structure 2a. The first bump 31 and the second bump 32 are respectively located at the position corresponding to the first position $P_1$ and the position corresponding to the second position $P_2$. Due to the arrangement of the first dummy metal layer 37 and/or the second dummy metal layer 38, the first bump pad 31 and the second bump pad 32 are substantially at a same level.

Then, the carrier 80 is removed. An external connector 13 is connected to the first conductive via 221 of the first dielectric layer 21 for external connection purpose. Then, a singulation process may be conducted to the wiring structure 2a, thus forming the substrate structure 1a as shown in FIG. 2.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate structure, comprising:
    a wiring structure having a first surface, and including a first pad disposed above the first surface and a second pad disposed above the first surface and physically separated from the first pad, wherein a first level is a distance between the first pad and the first surface, and a second level is a distance between the second pad and the first surface; and
    a compensation structure disposed between the second pad and the first surface, and configured for compensating the difference between the first level and the second level, wherein the wiring structure further includes a first via between the second pad and the compensation structure and a second via adjacent to the compensation structure, wherein a projection of the first via on the first surface and a projection of the second pad on the first surface are non-overlapping in a profile of the substrate structure, and the second pad is electrically connected to the second via through the first via.

2. The substrate structure of claim 1, wherein the wiring structure is configured for providing an electrical path from the second pad to the second via, and the electrical path includes at least two paths non-parallel with respect to each other.

3. The substrate structure of claim 1, wherein the wiring structure is configured for providing an electrical path from the second pad to the second via, and the electrical path is physically separated from the compensation structure.

4. The substrate structure of claim 1, wherein the wiring structure further comprises a conductive layer electrically connecting the first via and the second via.

5. The substrate structure of claim 4, wherein the conductive layer is physically separated from the compensation structure, and an entire bottom surface of a portion of the conductive layer above the compensation structure is covered by a dielectric layer completely.

6. The substrate structure of claim 5, wherein the conductive layer includes a segment disposed between the second pad and the compensation structure, and a space between the segment and the compensation structure is full of a dielectric layer solely.

7. The substrate structure of claim 5, wherein the conductive layer includes a segment disposed between the second pad and the compensation structure, and a dielectric layer disposed between the segment and the compensation structure is free of via.

8. The substrate structure of claim 1, further comprising an electronic component connects the first pad and the second pad.

9. The substrate structure of claim 1, wherein at least three of the second vias are stacked on top of one another adjacent to the compensation structure.

10. The substrate structure of claim 1, wherein the wiring structure is configured for providing an electrical path passing through the second pad and without passing through the compensation structure.

11. A substrate structure, comprising:
   a via;
   a pad electrically connected with the via, wherein the pad is non-overlapping with the via from a profile of the substrate structure;
   a compensation structure overlapping the pad from the profile of the substrate structure; and
   a conductive layer disposed between the pad and the compensation structure, and electrically connecting the via and the pad.

12. The substrate structure of claim 11, wherein a material of the compensation structure is substantially same as a material of the conductive layer.

13. The substrate structure of claim 11, wherein the pad is exposed on a surface of the substrate structure.

14. The substrate structure of claim 11, wherein the pad further includes a via portion contacting the conductive layer.

15. The substrate structure of claim 14, wherein the via portion of the pad overlaps with the compensation structure from the profile of the substrate structure.

16. A substrate structure, comprising:
   a wiring structure having a first region and a second region adjacent to the first region, wherein the wiring structure comprises a plurality of first vias in the first region and a plurality of second vias in the second region, and a density of the first vias in the first region is higher than a density of the second vias in the second region, wherein the wiring structure further comprises a conductive layer having a first portion disposed in the first region and a second portion disposed in the second region, the first portion includes at least one of the first vias and is electrically connected to the first pad, and the second portion includes at least one of the second vias and is electrically connected to the second pad, wherein the wiring structure further comprises a first dielectric layer covering the conductive layer, and the first dielectric layer is descending at a position between the first portion and the second portion of the conductive layer;
   a first pad disposed above the first region;
   a second pad disposed above the second region; and
   a compensation structure disposed in the second region and aligned with the second pad.

17. The substrate structure of claim 16, wherein the wiring structure further comprises a second dielectric layer disposed under the first dielectric layer, the conductive layer is interposed between the first dielectric layer and the second dielectric layer, and a portion of the conductive layer extends through the second dielectric layer.

18. A substrate structure, comprising:
   a wiring structure having a first surface, and including a first pad disposed above the first surface and a second pad disposed above the first surface and physically separated from the first pad, wherein a first level is a distance between the first pad and the first surface, and a second level is a distance between the second pad and the first surface; and
   a compensation structure disposed between the second pad and the first surface, and configured for compensating the difference between the first level and the second level, wherein the compensation structure is a dummy layer, wherein the wiring structure further includes a conductive layer electrically connecting the second pad, wherein a material of the compensation structure is substantially same as a material of the conductive layer.

19. The substrate structure of claim 18, wherein the compensation structure is a portion of the conductive layer.

* * * * *